United States Patent [19]
Delbare et al.

[11] Patent Number: 5,220,628
[45] Date of Patent: Jun. 15, 1993

[54] CIRCUIT BOARD ASSEMBLY

[75] Inventors: Wim Jozef Delbare, Gent-St. Amandsberg; Jan A. Oda, Vandewege Wondelgem, both of Belgium

[73] Assignee: ALCATEL N.V., Amsterdam, Netherlands

[21] Appl. No.: 813,279

[22] Filed: Dec. 27, 1991

[30] Foreign Application Priority Data

Jan. 29, 1991 [EP] European Pat. Off. ........ 91200170.8

[51] Int. Cl.⁵ .................................................. G02B 6/12
[52] U.S. Cl. .......................................... 385/14; 385/25
[58] Field of Search ................. 385/14, 25, 52, 22, 385/19

[56] References Cited

U.S. PATENT DOCUMENTS

| | | | |
|---|---|---|---|
| 3,674,914 | 7/1972 | Burr | 174/68 |
| 3,872,236 | 3/1975 | Swengel et al. | 174/68 |
| 4,303,302 | 12/1981 | Ramsey et al. | 385/22 X |
| 4,432,604 | 2/1984 | Schwab | 350/96 |
| 4,465,333 | 8/1984 | Caserta et al. | 350/96 |
| 4,651,343 | 3/1987 | Laor | 385/22 X |
| 4,653,845 | 3/1987 | Tremblay et al. | 350/96 |
| 4,657,339 | 4/1987 | Fick | 385/22 |
| 4,732,446 | 3/1988 | Gipson et al. | 350/96 |
| 5,054,870 | 10/1991 | Lösch et al. | 385/14 |

FOREIGN PATENT DOCUMENTS

| | | |
|---|---|---|
| 0166550 | 1/1986 | European Pat. Off. . |
| 54-13347 | 1/1979 | Japan . |
| 59-121008 | 7/1984 | Japan . |

*Primary Examiner*—John D. Lee
*Assistant Examiner*—S. W. Barns
*Attorney, Agent, or Firm*—Spencer, Frank & Schneider

[57] ABSTRACT

A circuit board assembly includes a circuit board with an optical fiber embedded in a flexible layer of the board. The flexible layer is detachable whereby it may be bent out of the board via an opening in an upper layer thereof to allow coupling of the fiber with an input/output device, e.g., another fiber. In an alternative embodiment the flexible layer extends beyond the edges of the board.

5 Claims, 1 Drawing Sheet

CIRCUIT BOARD ASSEMBLY

BACKGROUND OF THE INVENTION

1. Field of the Invention

The present invention relates to a circuit board assembly including at least one circuit board with at least one embedded optical waveguide which has at least one locally bent part reaching at least an upper/lower external surface of the circuit board to enable its coupling to an optical input/output device.

2. Background Information

Such a circuit board assembly is generally known in the art, e.g. from the U.S. Pat. No. 3,872,236.

In this known assembly the waveguide is an optical fiber which is embedded in a substrate, the bent part of which reaches the surface of the broad, this bent part being polished or cut to form a tap enabling its coupling with the input/output device.

Light transported by the fiber either leaves the latter at the location of the tap under a well defined angle which depends on the curvature of the fibre, or is injected therein under a well-defined angle. As a consequence, the input/output device has to be coupled to the fiber either by abutment contact with the tap, or by using optical devices such as lenses, prisms, holograms etc, to guide the light from/to the input/output device to/from the fiber tap at the required angle.

SUMMARY OF THE INVENTION

An object of the present invention is to provide a circuit board assembly of the described above type, but which allows the coupling of an input/output device to the locally bent part in an easy and flexible way.

According to the invention this object is achieved due to the fact that the waveguide forms part of a detachable flexible layer, a portion of which comprises the bent part and is detached from an adjacent layer.

The detached portion of the flexible layer can in this way be brought outside the board where the embedded fiber can be cut or polished to realize an optical tap. The tap can then be curved with its flexible layer, to achieve the required angle for coupling with the input/output device.

The present invention also relates to a circuit board assembly with at least one circuit board with a least one embedded optical waveguide. This circuit board assembly is characterized in that the optical waveguide is embedded in a flexible layer having at least one adjacent rigid layer, as well as an end extending beyond the edges of this rigid layer.

The flexible end thus allows the optical waveguide embedded in the circuit board to be optically coupled with an input/output device, even when the latter is disposed at an angle with respect to this circuit board.

BRIEF DESCRIPTION OF THE DRAWINGS

The above mentioned and other objects and features of the invention will become more apparent and the invention itself will be best understood by referring to the following description of embodiments taken in conjunction with the accompanying drawings wherein.

In these figures similar elements are indicated by the same reference number.

DETAILED DESCRIPTION OF THE PREFERRED EMBODIMENTS

Figure 1:
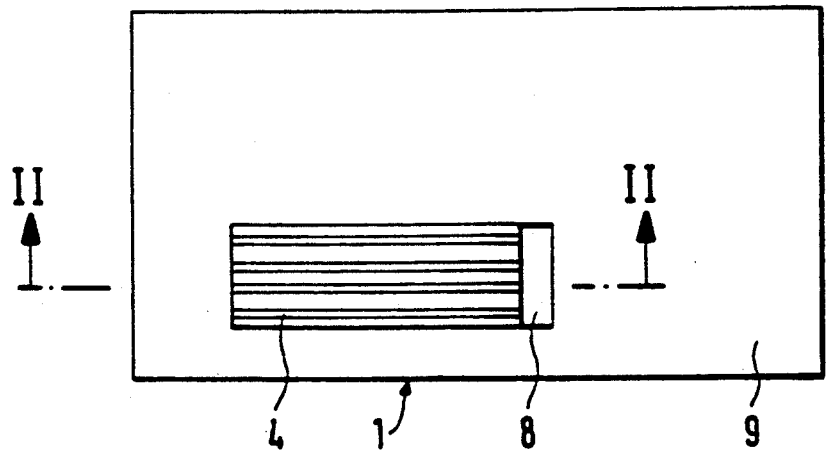
FIG. 1 is a top view of an embodiment of a circuit board assembly according to the invention.
Figure 2:
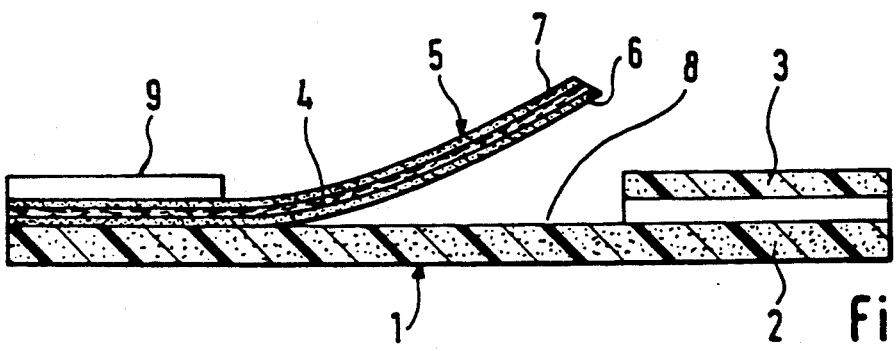
FIG. 2 is a cross-section, on an enlarged scale, along line II—II of FIG. 1.

The circuit board assembly which is generally indicated by reference numeral 1 in FIGS. 1 and 2 comprises a lower layer 2 and an upper layer 3 which are both made of an epoxy, as well as a flexible middle-layer 5 which comprises optical fibers 4 glued in between two PYRALUX (a Registered Trademark of the Du Pont Company) flexible laminate sublayers 6 and 7. The latter sublayers 6 and 7 are fixed to the lower and upper layers 2 and 3 respectively. The flexible layer 5 is made detachable from the sublayers 2 and 3, at least at the location of a rectangular opening 8 in the upper layer 3. As shown, the portion of the flexible layer 5 which is accessible through the opening 8 is detached from the lower layer 2 and bent out of the board 1 beyond the upper surface 9 thereof where it can be coupled to an optical input/output device.

Figure 3:
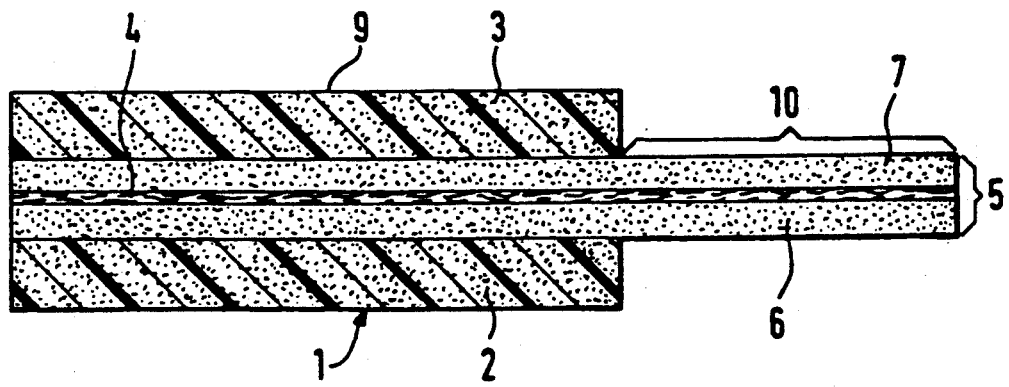
FIG. 3 is a cross-section of a further embodiment of a circuit board assembly according to the invention.

Reference is now made to FIG. 3 which shows an alternative embodiment of a circuit board assembly with a flexible layer 5, where a part 10 of this flexible layer 5 extends beyond the layers 2 and 3 and forms a kind of ribbon cable which is integrated in the board. Thus the optical fibers, such as 4, integrated in this circuit board may be easily coupled to for instance optical fibers integrated in a backpanel making a substantially right angle with the circuit board or to any other input/output device even if the latter is located at a relatively large distance from that board.

It should be noted that the circuit board assemblies described above may have electrical wires embedded therein in a way similar to the optical fibers, so that the electrical wires can be brought outside the circuit board embedded in a flexible layer together with the optical fibers.

While the principles of the invention have been described above in connection with specific apparatus, it is to be clearly understood that this description is made only by way of example and not as a limitation on the scope of the invention.

We claim:

1. A circuit board assembly including at least one circuit board with at least one embedded optical waveguide, wherein said optical waveguide is embedded in a flexible layer of said circuit board, said circuit board having at least one rigid layer adjacent to said flexible layer, said flexible layer with said waveguide embedded therein extending beyond an edge of said circuit board rigid layer.

2. The circuit board assembly according to claim 1, wherein the flexible layer is further provided with electrical wires embedded therein.

3. A circuit board assembly comprising at least a lower layer, an upper layer and a middle layer, wherein:
   the middle layer comprises at least one optical fiber disposed in a flexible laminate, the middle layer is detachable from the lower layer at at least one portion, and the upper layer is provided with an opening disposed over the at least one detachable portion of the middle layer, whereby the optical fiber is accessible by bending the middle layer to extend through the opening in the upper layer.

4. The circuit board assembly according to claim 3, wherein the middle layer is further provided with electrical wires embedded therein.

5. The circuit board assembly according to claim 3, wherein the lower layer and the upper layer are composed of epoxy, and wherein the middle layer comprises an optical fiber glued between two layers of flexible laminate material composed of PYRALUX.

* * * * *

UNITED STATES PATENT AND TRADEMARK OFFICE
CERTIFICATE OF CORRECTION

PATENT NO. : 5,220,628
DATED      : June 15th, 1993
INVENTOR(S) : Wim Jozef Robert DELBARE and
              Jan Alfons Oda VANDEWEGE It is certified that error appears in the above-indentified patent and that said Letters Patent is hereby corrected as shown below:

On the Title page of the patent document under [75], the inventors' names should be shown as:

--Wim Jozef Robert DELBARE-- and

--Jan Alfons Oda VANDEWEGE--.

Signed and Sealed this

First Day of February, 1994

Attest:

BRUCE LEHMAN

*Attesting Officer*          *Commissioner of Patents and Trademarks*